(12) United States Patent
Nguyen et al.

(10) Patent No.: US 9,661,756 B1
(45) Date of Patent: May 23, 2017

(54) NANO-COPPER PILLAR INTERCONNECTS AND METHODS THEREOF

(71) Applicant: Flextronics AP, LLC, Broomfield, CO (US)

(72) Inventors: Jennifer Nguyen, Milpitas, CA (US); David Geiger, Dublin, CA (US); Anwar Mohammed, San Jose, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/455,642

(22) Filed: Aug. 8, 2014

Related U.S. Application Data

(60) Provisional application No. 61/870,627, filed on Aug. 27, 2013.

(51) Int. Cl.
| | |
|---|---|
| *H05K 1/09* | (2006.01) |
| *H05K 3/24* | (2006.01) |
| *H05K 1/11* | (2006.01) |
| *H05K 3/30* | (2006.01) |
| *H05K 3/40* | (2006.01) |

(52) U.S. Cl.
CPC ............ *H05K 3/244* (2013.01); *H05K 1/097* (2013.01); *H05K 1/111* (2013.01); *H05K 3/30* (2013.01); *H05K 3/40* (2013.01)

(58) Field of Classification Search
CPC ........ H05K 3/244; H05K 1/097; H05K 1/111; H05K 3/30; H05K 3/40
USPC ................. 174/257, 250, 255, 256, 259–261
See application file for complete search history.

(56) References Cited

U.S. PATENT DOCUMENTS

| | | |
|---|---|---|
| 6,168,972 B1 | 1/2001 | Wang |
| 2004/0000425 A1 | 1/2004 | White |
| 2007/0074391 A1 | 4/2007 | Totokawa |
| 2007/0221404 A1 | 9/2007 | Das |
| 2008/0157322 A1 | 7/2008 | Tang |
| 2008/0157324 A1 | 7/2008 | Tang et al. |
| 2009/0083975 A1 | 4/2009 | Lee |
| 2009/0301606 A1 | 12/2009 | Ueshima |
| 2010/0025091 A1 | 2/2010 | Ferdinandi |
| 2010/0078788 A1* | 4/2010 | Wagiman ......... H01L 23/49811 257/686 |
| 2013/0105841 A1* | 5/2013 | Namiki ................. H01L 33/60 257/98 |

(Continued)

*Primary Examiner* — Tremesha S Willis
(74) *Attorney, Agent, or Firm* — Haverstock & Owens LLP

(57) ABSTRACT

Embodiments of the present invention relate to nano-copper pillar interconnects. Nano-copper material is a mixture of nano-copper particles and one or more organic fluxes. In some embodiments, the one or more organic fluxes include organic solvents that help bind the nano-copper particles together and allow the nano-copper material to be printable. The nano-copper material is applied onto bond pads on a printed circuit board (PCB) via a printing process, a dipping process or the like, to form nano-copper covered PCB bond pads. A component can thereafter be coupled with the PCB at the nano-copper covered PCB bond pads. What is left when the solvents evaporate are nano-copper pillar interconnects that form, coupling the component with the PCB bond pads. The nano-copper pillar interconnects are of pure copper.

15 Claims, 2 Drawing Sheets

(56) References Cited

U.S. PATENT DOCUMENTS

| | | | |
|---|---|---|---|
| 2013/0209672 A1 | 8/2013 | Reinmuth | |
| 2013/0265735 A1* | 10/2013 | Nakatani | H01B 1/22 361/783 |
| 2014/0085579 A1* | 3/2014 | Fan | G02F 1/1339 349/123 |
| 2015/0001452 A1* | 1/2015 | Kurihara | C09D 11/52 252/514 |

* cited by examiner

NANO-COPPER PILLAR INTERCONNECTS AND METHODS THEREOF

RELATED APPLICATIONS

This application claims benefit of priority under 35 U.S.C. section 119(e) of the U.S. Provisional Patent Application Ser. No. 61/870,627, filed Aug. 27, 2013, entitled "Interconnect Methods," which is hereby incorporated by reference in its entirety.

FIELD OF INVENTION

The present invention relates to interconnects. More particularly, the present invention relates to nano-copper pillar interconnects and methods thereof.

BACKGROUND OF THE INVENTION

Solder is an interconnect material used in the assembly of electronic device to system boards. Solder interconnects are able to provide electrical continuity and mechanical attachment between the electronic device and the system board. However, as electronic devices are becoming smaller in size and more complex, solder does not have the physical properties to enable it to be used at smaller package geometries.

BRIEF SUMMARY OF THE INVENTION

Embodiments of the present invention relate to nano-copper pillar interconnects. Nano-copper material is a mixture of nano-copper particles and one or more organic fluxes. In some embodiments, the one or more organic fluxes include organic solvents that help bind the nano-copper particles together and allow the nano-copper material to be printable. The nano-copper material is applied onto bond pads on a printed circuit board (PCB) via a printing process, a dipping process or the like, to form nano-copper covered PCB bond pads. A component can thereafter be coupled with the PCB at the nano-copper covered PCB bond pads. What is left when the solvents evaporate are nano-copper pillar interconnects that form, coupling the component with the PCB bond pads. The nano-copper pillar interconnects are of substantially pure copper.

In one aspect, a system includes a printed circuit board (PCB) including a plurality of PCB bond pads and a component. The component can be a leaded component, a leadless component or a ball grid array (BGA) component.

The system also includes a nano-copper material applied onto the plurality of PCB bond pads and interfaces with a bottom side of the component. The nano-copper material is a mixture that includes nano-copper particles. In some embodiments, the nano-copper particles have a diameter of 10 nm or less. In some embodiments, the mixture includes organic fluxes, such as activators, solvents, additives or a combination thereof. In some embodiments, the solvents enable the nano-copper material to be amendable for printing. The mixture can be in a paste form.

In some embodiments, the nano-copper material becomes nano-copper pillar interconnects after sintering, wherein the nano-copper pillar interconnects couple the PCB and the component. The nano-copper pillar interconnects are preferably of substantially pure copper.

In some embodiments, the system also includes a stencil for transferring the nano-copper material onto the PCB.

In another aspect, a method includes obtaining a printed circuit board (PCB) that includes a plurality of PCB bond pads and obtaining a component. The component can be a leaded component, a leadless component or a ball grid array (BGA) component.

The method also includes obtaining a nano-copper material. Obtaining a nano-copper material includes forming a mixture that includes nano-copper particles. In some embodiments, the nano-copper particles have a particle size of 10 nm in diameter. In some embodiments, mixture includes organic fluxes, such as activators, solvents, additives or a combination thereof.

The method also includes transferring the nano-copper material onto the plurality of PCB bond pads, thereby forming nano-copper covered PCB bond pads. In some embodiments, transferring the nano-copper material includes dipping the plurality of PCB bond pads in the nano-copper material. In some embodiments, transferring the nano-copper material includes printing the nano-copper material onto the plurality of PCB bond pads.

The method also includes placing the component on the nano-copper covered PCB bond pads such that the nano-copper material interfaces with a bottom side of the component.

In some embodiments, the method also includes sintering at a temperature of 200° C., thereby forming nano-copper pillar interconnects, wherein the nano-copper pillar interconnects couple the PCB and the component. The nano-copper pillar interconnects are of pure copper.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Copper is becoming the preferred material for next generation interconnects. It can be formed into pillars, bumps or studs. Compared to solder interconnects, these copper interconnects allow for greater ratios of height to width and for greater density interconnects in a given area. Copper meets the demand for smaller geometries and higher IO counts by providing better thermal and electrical performance compared to solder interconnects.

Embodiments of the present invention relate to nano-copper pillar interconnects. Nano-copper material is a mixture of nano-copper particles and one or more organic fluxes. In some embodiments, the one or more organic fluxes include organic solvents that help bind the nano-copper particles together and allow the nano-copper material to be printable. The nano-copper material is applied onto bond pads on a printed circuit board (PCB) via a printing process, a dipping process or the like, to form nano-copper covered PCB bond pads. A component can thereafter be coupled with the PCB at the nano-copper covered PCB bond pads. What is left when the solvents evaporate are nano-copper pillar interconnects that form, coupling the component with the PCB bond pads. The nano-copper pillar interconnects are of pure copper.

Figure 1:
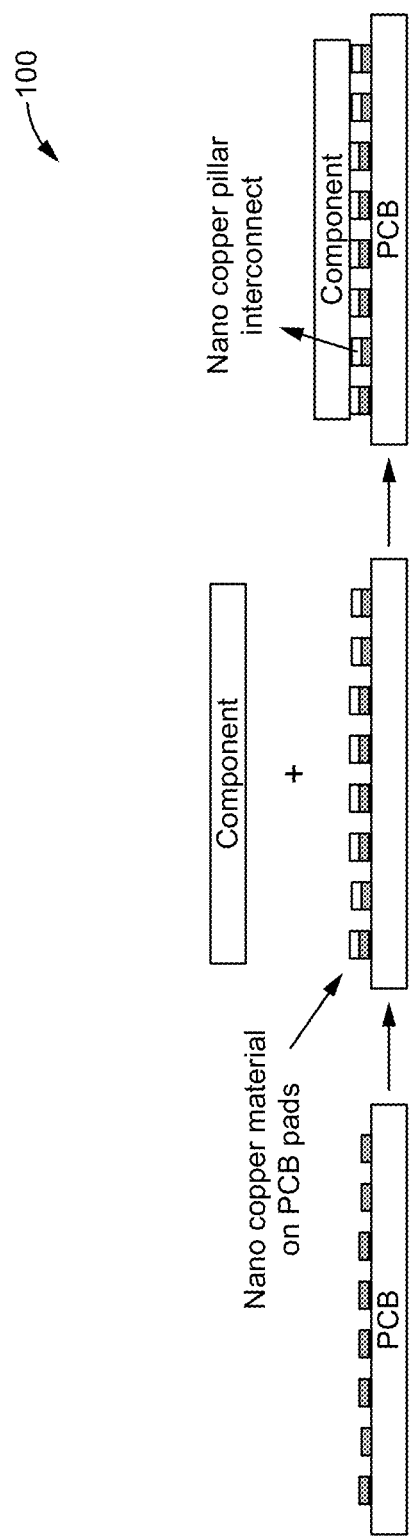
FIG. 1 illustrates exemplary nano-copper pillar interconnects in accordance with some embodiments of the present invention.

FIG. 1 illustrates exemplary nano-copper pillar interconnects 100 in accordance with some embodiments of the present invention. A PCB is obtained. Typically, the PCB mechanically supports and electrically connects one or more electronic components using conductive PCB bond (contact) pads and other features, such as tracks.

Nano-copper material is applied onto the PCB bond pads to form nano-copper covered PCB bond pads. The nano-copper material is typically a mixture. In some embodiments, the mixture is in a paste form or in a slurry form. The mixture includes nano-copper particles. In some embodiments, a nano-copper particle has a diameter of 10 nm or less. The mixture also includes organic fluxes, such as activators, solvents, additives or a combination thereof. Other organic fluxes are also contemplated. In some embodiments, the organic solvents make the nano-copper material more amendable for printing. The contents of the mixture, and thus the viscosity of the mixture, depend on the process deposition.

In some embodiments, the PCB bond pads can be dipped in the nano-copper material, which is contained for example in a vat, such that the nano-copper material is applied onto the PCB bond pads simultaneously. Alternatively, the nano-copper material is printed on the PCB bond pads. For example, a stencil can be used to transfer the nano-copper material onto the PCB. In particular, the stencil has openings that correspond with the PCB bond pads. Once the stencil is properly aligned over the PCB, the nano-copper material is applied over the openings (making a single pass, using a print head and squeegee blade). When the stencil is separated from the PCB, the nano-copper material remains on the PCB bond pads.

A component is placed on the nano-copper covered PCB bond pads, and the entirety is sintered at a low temperature of 200° C. or less. In particular, nano-copper particles having a particle size no larger than 10 nm in diameter are able to fused at 200° C. The component can be of any component type. For example, the component can be a leaded component, a leadless component or a ball grid array (BGA) component. The component can be a memory package or a logic package.

After sintering, nano-copper pillar interconnects are formed. The organic fluxes typically evaporate. Typically, the nano-copper pillar interconnects are of pure copper. The nano-copper pillar interconnects provide strong mechanical adhesion, coupling the component and the PCB together.

Unlike existing copper pillar fabrication processes that require fusing copper at a temperature greater than 300° C. (usually at 360° C.), the current process 100 can be carried out at a lower temperature of 200° C. or less. Processing at a lower temperature is advantageous because some components are not able to sustain high temperatures, which compromises the functionality of these components. Further, after sintering, the nano-copper pillar interconnects or joints can be operated at a temperature of 350° C. or greater.

Figure 2:
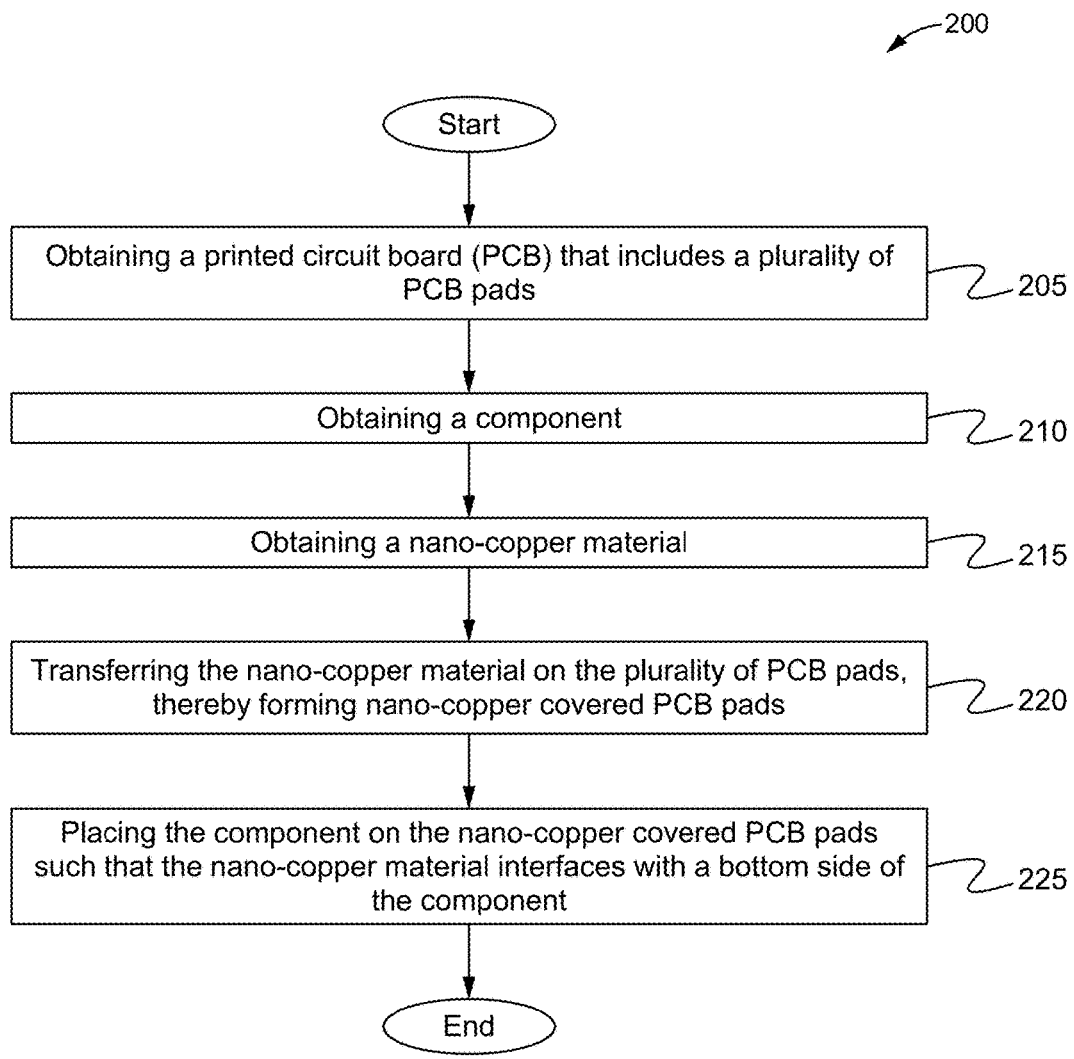
FIG. 2 illustrates an exemplary method in accordance with some embodiments of the present invention.

FIG. 2 illustrates an exemplary method 200 in accordance with some embodiments of the present invention. At a step 205, a PCB is obtained. Typically, the PCB includes a plurality of PCB bond pads.

At a step 210, a component is obtained. The component can be of any component type. For example, the component can be a leaded component, a leadless component or a BGA component.

At a step 215, a nano-copper material is obtained. In some embodiments, the nano-copper material is obtained by forming a mixture that include nano-copper particles. The nano-copper particles have a diameter of 10 nm or less. The mixture includes organic fluxes, such as activators, solvents, additives or a combination thereof.

At a step 220, the nano-copper material is transferred onto the plurality of PCB bond pads, thereby forming nano-copper covered PCB bond pads. In some embodiments, the nano-copper covered PCB bond pads only includes the nano-copper material on a planar side of the PCB bond pads. In some embodiments, the nano-copper material also covers at least a portion of lateral sides of the PCB bond pads.

In some embodiments, the nano-copper material can be transferred by a dipping process. The dipping process includes dipping the plurality of PCB bond pads in the nano-copper material. Alternatively, the nano-copper material can be transferred by a printing process. The printing process includes printing the nano-copper material on the plurality of PCB bond pads, such as by a stencil, a print head and a squeegee blade. Other transfer processes are contemplated.

At a step 225, the component is placed on the nano-copper covered PCB bond pads such that the nano-copper material interfaces with a bottom side of the component. Typically, bond or contact pads of the component are aligned with the nano-copper covered PCB bond pads.

The entirety is sintered at a temperature of 200° C., thereby forming nano-copper pillar interconnects. The nano-copper pillar interconnects couple the PCB and the component. The nano-copper pillar interconnects are of pure copper and provide strong mechanical adhesion between the PCB bond pads and the component.

The current process of forming nano-copper pillar interconnects provides numerous advantageous over traditional solder interconnect processes and prior art copper pillar fabrication processes, including:
  Ultra fine pitch of 50 μm
  Cost reduction
  Reduction of signal impedance
  Better thermal conductivity
  Lead free
  Elimination or reduction of tin (Sn) whiskers
  Elimination or reduction of silver (Ag) migration Although nano-copper material has been discussed, it is contemplated that other nano materials, such as nano-silver and nano-aluminum materials, can also be used. The pillar interconnects that form are of pure silver or pure aluminum, depending on the nano-material used.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A method comprising:
   obtaining a printed circuit board (PCB) that includes a plurality of PCB bond pads;
   obtaining a component;
   obtaining a nano-copper material, further comprising forming a mixture that includes organic fluxes and nano-copper particles;
   transferring the nano-copper material onto the plurality of PCB bond pads, thereby forming nano-copper covered PCB bond pads, wherein transferring the nano-copper material includes dipping the plurality of PCB bond pads in the nano-copper material; and
   placing the component on the nano-copper covered PCB bond pads such that the nano-copper material interfaces with a bottom side of the component.

2. The method of claim 1, wherein the nano-copper particles have a diameter of 10 nm.

3. The method of claim 2, wherein the organic fluxes bind the nano-copper particles together, and wherein evaporation of the organic fluxes results in formation of joints of pure copper coupling the component with the PCB together.

4. The method of claim 3, wherein the organic fluxes include activators, solvents, additives or a combination thereof.

5. The method of claim 1, further comprising sintering at a temperature of 200° C., thereby forming nano-copper pillar interconnects, wherein the nano-copper pillar interconnects couple the PCB and the component.

6. The method of claim 5, wherein the nano-copper pillar interconnects are of pure copper.

7. A method comprising:
   obtaining a printed circuit board (PCB) that includes a plurality of PCB bond pads;
   obtaining a component;
   obtaining a nano-copper material, further comprising forming a mixture that includes organic fluxes and nano-copper particles;
   transferring the nano-copper material onto the plurality of PCB bond pads, thereby forming nano-copper covered PCB bond pads, wherein transferring the nano-copper material includes printing the nano-copper material on the plurality of PCB bond pads; and
   placing the component on the nano-copper covered PCB bond pads such that the nano-copper material interfaces with a bottom side of the component.

8. The method of claim 7, wherein the nano-copper particles have a particle size of 10 nm in diameter.

9. The method of claim 7, wherein the organic fluxes include activators, solvents, additives or a combination thereof.

10. The method of claim 9, wherein the solvents enable the nano-copper material to be amendable for printing.

11. The method of claim 7, wherein the mixture is in a paste form.

12. The method of claim 7, wherein the component is a leaded component, a leadless component or a ball grid array (BGA) component.

13. The method of claim 7, further comprising sintering the PCB and the component, wherein the nano-copper material becomes nano-copper pillar interconnects after the sintering, wherein the nano-copper pillar interconnects couple the PCB and the component.

14. The method of claim 13, wherein the nano-copper pillar interconnects are of pure copper.

15. The method of claim 7, further using a stencil to transfer the nano-copper material onto the PCB.

* * * * *